(12) United States Patent
Suzuki

(10) Patent No.: US 6,608,743 B1
(45) Date of Patent: Aug. 19, 2003

(54) DELAY LOCKED LOOP, SYNCHRONIZING METHOD FOR THE SAME AND SEMICONDUCTOR DEVICE EQUIPPED WITH THE SAME

(75) Inventor: Misao Suzuki, Tokyo (JP)

(73) Assignees: NEC Corporation (JP); NEC Electronics Corporation (JP)

( * ) Notice: Subject to any disclaimer, the term of this patent is extended or adjusted under 35 U.S.C. 154(b) by 251 days.

(21) Appl. No.: 09/692,632

(22) Filed: Oct. 19, 2000

(30) Foreign Application Priority Data

Oct. 19, 1999 (JP) .......................................... 11-296709

(51) Int. Cl.$^7$ ................................................ H02K 3/00
(52) U.S. Cl. ...................................... 361/100; 257/723
(58) Field of Search ................................. 361/100, 101; 365/63, 72, 194, 233, 195, 210; 257/723, 779, 784, 78

(56) References Cited

U.S. PATENT DOCUMENTS

| | | | | |
|---|---|---|---|---|
| 5,255,370 A | * | 10/1993 | Sako et al. ................. | 395/250 |
| 5,566,108 A | * | 10/1996 | Kitamura .................... | 365/233 |
| 5,740,123 A | * | 4/1998 | Uchida ....................... | 365/233 |
| 5,822,255 A | * | 10/1998 | Uchida ....................... | 365/294 |

FOREIGN PATENT DOCUMENTS

| | | |
|---|---|---|
| KR | 1998-18654 | 6/1998 |
| KR | 1999-66713 | 8/1999 |

OTHER PUBLICATIONS

Korean Office Action issued Jan. 24, 2003 (w/ English translation of relevant portions).

* cited by examiner

Primary Examiner—Rajnikant B. Patel
(74) Attorney, Agent, or Firm—Dickstein, Shapiro, Morin & Oshinsky, LLP.

(57) ABSTRACT

The delay locked operation is intermittently conducted only when a command or signal is supplied from outside, and a delay time changed in the delay locked operation is retained thereafter in the period that the command or signal is not supplied. Also, the dummy pattern used in conducting the phase comparison between internal clock ICK and external clock ECK is obtained through the output circuit that has the same characteristics as the output circuit from which data are actually output. Therefore, the accurate coincidence between internal clock ICK and external clock ECK can be obtained regardless of the parasitic inductive and capacitive loads that are influenced depending on the characteristic of package and the mounting conditions. Thereby, the delay locked operation can be always conducted accurately.

19 Claims, 7 Drawing Sheets

DELAY LOCKED LOOP, SYNCHRONIZING METHOD FOR THE SAME AND SEMICONDUCTOR DEVICE EQUIPPED WITH THE SAME

FIELD OF THE INVENTION

This invention relates to a delay locked loop, a synchronizing method for the delay locked loop and a semiconductor device equipped with the delay locked loop. Particularly, this invention relates to a delay locked loop that allows an internal clock, which is obtained delaying an external clock supplied from outside by a given delay time, to be synchronized with the external clock.

BACKGROUND OF THE INVENTION

One of typical methods of operating a large-scale and complex digital circuit with good stability and efficiency is synchronous circuit designing that allows all logic cells (flip flop (FF), latch etc.) in the digital circuit to operate synchronizing with one clock. Semiconductor devices such as large-scale integrated circuit (LSI), very-large-scale integrated circuit (VLSI) and ultra-large-scale integrated circuit also have one digital circuit formed on the chip, and they are designed mostly by the synchronous circuit designing.

In order to lead a digital circuit designed by such synchronous circuit designing to accurate operation, all logic cells need to operate at the same timing. This is because, if there is a gap between clocks that are input to the respective logic cells, a problem described below occurs. For example, when multiple FFs cascade-connected compose a shift register, if the rise or fall of clock input to a subsequent FF slightly gets behind the rise or fall of clock input to the previous FF, the output data of the previous FF changes in the instant that the subsequent FF is going to take the output data of the previous FF. Therefore, the subsequent FF may incur a malfunction, for example, data that is due to delay by one cycle maybe, without delay, output from the subsequent FF. Such a phenomenon is called racing.

Also in synchronous semiconductor storage, responding to data reading command to be sent from CPU, data is read synchronizing with an internal clock that is generated synchronizing with an external clock supplied from outside. However, if out of synchronization, the PCU fails to accurately read data, therefore the CPU and the entire system will be subjected to a malfunction.

In recent years, the number of logic cells composing a semiconductor device increases as the integration density and operation speed of a semiconductor device such as LSI increases. When a digital circuit is formed on chip of such a semiconductor device, the number of logic cells to operate simultaneously increases. Therefore, the risk of occurrence of the above-mentioned racing and an error in data reading becomes high.

Because of this, recently, produced are semiconductor devices that a phase-adjusting circuit such as phase locked loop (PLL) or delay locked loop (DLL) is installed so that a clock supplied to all logic cells is synchronized with an external clock supplied from outside or an internally-generated clock supplied from an internal clock generating means.

PLL is, for example, composed of a phase comparison circuit, a low-pass filter (LPF) and a voltage-controlled oscillator (VCO). The phase comparison circuit compares a phase of the external clock or internally-generated clock with a phase of internal clock supplied from the VCO, and outputs a phase error signal according to its phase error. The LPF smoothes the phase error signal, and outputs it as control voltage. The VCO oscillates at an internal clock based on the control voltage, and supplies the internal clock to the phase comparison circuit.

DLL is, for example, composed of a phase comparison circuit, a delay circuit and an LPF. The phase comparison circuit compares a phase of the external clock or internally-generated clock with a phase of internal clock supplied from the VCO, and outputs a phase error signal according to its phase error. The LPF smoothes the phase error signal, and outputs it as control voltage. The delay circuit makes the external clock or internally-generated clock delay based on the control voltage, and supplies it as an internal clock to the phase comparison circuit.

Since, of these phase-adjusting circuits, the DLL is not equipped with especially the VCO as installed in the PLL, the DLL allows the phase adjusting circuit to be composed with fewer number of elements and low power consumption.

FIG. 1 is a block diagram showing an example of partial composition of semiconductor device equipped with a conventional DLL.

In this example, the semiconductor device is composed of a phase comparison circuit 1, a counter 2, a digital-to-analogue converter (DAC) 3, a delay circuit 4, flip flops (FF) 5 and 6, buffers 7 and 8, and an output dummy circuit 9.

The phase comparison circuit 1 compares a phase of external lock ECK supplied from outside with a phase of dummy data DDT supplied from the output dummy circuit 9. When the phase of external clock ECK is behind the phase of dummy data DDT, the phase comparison circuit 1 outputs an up clock UCK with pulses of number according to the phase difference, to the counter 2. When the phase of external clock ECK is ahead of the phase of dummy data DDT, the phase comparison circuit 1 outputs a down clock DCK with pulses of number according to the phase difference, to the counter 2.

The counter 2 outputs a count value CT to be counted up or counted down according to the up clock UCK or down clock DCK supplied from the phase comparison circuit 1, to the DAC 3.

The DAC 3 converts the count value CT supplied from the counter 2 into analogue delay voltage $V_D$, and supplies it to the delay circuit 4.

The delay circuit 4 allows the delay time to be changed according to the delay voltage $V_D$ supplied from the DAC 3, and delays the external clock ECK by that delay time, then outputting it as an internal clock ICK. The range of the delay time changed in the delay circuit 4 is set to be at least one cycle of the external clock ECK. For example, when the frequency of the external clock ECK is 100 MHz, the range of changing is set to be 0 to 10 ns.

FIG. 2 shows an example of composition of the delay circuit 4. The delay circuit 4 is composed of inverters 11 to 14, N-channel FETs 15 to 17 and capacitors 18 to 20. The inverters 11 to 14 are cascade-connected, and the external clock ECK is applied to the input of the inverter 11 and the internal clock ICK is output from the output of the inverter 14. The respective gates of the FETs 15 to 17 are connected each other, and delay voltage $V_D$ is applied to the gates. The FET 15 has the source connected to the connection point between the output of the inverter 11 and the input of the inverter 12, and has the drain connected to one end of the capacitor 18, the other end of the capacitor 18 being grounded. Similarly, the FET 16 has the source connected to the connection point between the output of the inverter 12 and the input of the inverter 13, and has the drain connected to one end of the capacitor 19, the other end of the capacitor 19 being grounded. The FET 17 has the source connected to the connection point between the output of the inverter 13 and the input of the inverter 14, and has the drain connected to one end of the capacitor 20, the other end of the capacitor 20 being grounded.

Since the delay time of the delay circuit 4 cannot be shorter than the sum of the delay times of the four inverters 11 to 14, if the phase of external clock ECK is ahead of the phase of dummy data DDT, by delaying the phase of internal clock ICK by amount of phase obtained subtracting the phase being advanced from the phase of one cycle, the phase of external clock ECK is made to coincide with the phase of dummy data DDT, i.e., the phase of internal clock ICK. For example, when the frequency of external clock ECK is 100 MHz, one cycle is 10 ns. Given that the sum of the delay times of the four inverters 11 to 14 is, for example, 5 ns, when the count number CT of the counter 2 is five and the delay voltage is 0.5 V, the delay time of the delay circuit 4 is further increased by 5 ns, thereby being 10 ns totally. In this way, the phase of external clock ECK is made to coincide with the phase of dummy data DDT.

In FIG. 1, the FFs 5 and 6 hold and output data to be supplied from a circuit element (not shown) in the semiconductor device synchronizing with the rise of internal clock ICK supplied from its clock input C, and supply them to the buffers 7 and 8. The buffers 7 and 8 buffer the data supplied from the FFs 5 and 6, respectively, and output them as data $DT_1$ and $DT_2$ from the output terminals. The FF 5 and the buffer 7, and the FF 6 and the buffer 8 compose the output circuit of the data $DT_1$ and $DT_2$, respectively. The output dummy circuit 9 corresponds to the pseudo-composition of FF, buffer or capacitance of load connected to the output terminal that compose the output circuit, and outputs dummy data DDT being synchronized with the rise of internal clock ICK to the phase comparison circuit 1. The delay time $T_{DD}$ Of the output dummy circuit 9 is set to be delay time $T_D$ obtained summing the delay time of the FF 5 and the buffer 7 with a given load added.

The phase comparison circuit 1, the counter 2, the DAC 3, the delay circuit 4 and the output dummy circuit 9 compose the DLL.

The partial operation of the semiconductor device thus composed is explained below.

First, given that the frequency of external clock ECK is 100 MHz, for example, when the phase of external clock ECK is slightly behind the phase of dummy data DDT and the rise of external clock ECK delays by 1 ns to the rise of dummy data DDT, the phase comparison circuit 1 outputs the up clock UCK of, e.g. one clock to the counter 2.

In this case, the counter 2 supplies the count value CT of "1", which is counted up according to the up clock UCK of one clock supplied from the phase comparison circuit 1, to the DAC 3. The DAC 3 converts the count value CT of "1", which is supplied from the counter 2, into analogue delay voltage $V_D$, 0.1 V in this case, and outputs it to the delay circuit 4. In the delay circuit 4, delay voltage $V_D$ of 0.1 V is applied to the gate of the FETs 15 to 17. Therefore, the source-to-drain conductance (reciprocal number of resistivity) of the FETs 15 to 17 increases according to the delay voltage $V_D$ of 0.1 V. So, since the connection point between the output of the inverter 11 and the input of the inverter 12 is connected with one end of the capacitor 18 based on the above value of conductance, the delay time of the unit delay circuit composed of the inverter 11, FET 15 and capacitor 18 becomes longer. Similarly, the delay time of the unit delay circuit composed of the inverter 12, FET 16 and capacitor 19, and the delay time of the unit delay circuit composed of the inverter 13, FET 17 and capacitor 20 also become longer. Therefore, the delay time of the entire delay circuit 4 becomes longer. Accordingly, the internal clock ICK is delayed more than before, thereby the phase of external clock ECK coincides with the phase of dummy data DDT. So, data can be output from the buffers 7 and 8 synchronizing with the phase of external clock ECK.

By this composition, read from the semiconductor device are data DT1 and DT2 to be synchronized with the internal clock ICK generated synchronizing with the external clock ECK.

Meanwhile, in the semiconductor device equipped with the conventional DLL, the output dummy circuit 9 corresponds to the pseudo-composition of FF, buffer or capacitance of load connected to the output terminal that compose the output circuit. However, in a case that the output terminal is connected to a lead terminal, or in a case that there occurs parasitically an inductive load because of the semiconductor device being encapsulated in a package, or in a case that there occurs parasitically a capacitive load because of the semiconductor device being mounted on a printed board and soldered onto its pattern, since the load varies depending on the characteristics of package or the mounting conditions, it is impossible to make the output dummy circuit 9 with the same characteristic as the output circuit that actually outputs data while considering all of the conditions. Especially the inductance cannot be made even by using the current technology of semiconductor device.

Thus, even if the phase of dummy data DDT to be output from the output dummy circuit 9 that does not have the same characteristic as the output circuit that actually outputs data is made to correspond to the phase of external clock ECK, data $DT_1$ and $DT_2$ actually output from the output circuit are, as shown in FIG. 3, not capable of being synchronized with the external clock ECK. Accordingly, especially in synchronous semiconductor storage, since data read from that may not be synchronized with the external clock ECK, the PCU fails to accurately read data, therefore the CPU and the entire system will be subjected to a malfunction.

Also, in the semiconductor device equipped with the conventional DLL, since the output dummy circuit 9 composing the DLL always operates, the power consumption of the output dummy circuit 9 is much more than that of other circuit elements composing the semiconductor device, therefore it is not negligible. Namely, the delay circuit and the output dummy circuit 9 are, in general, composed of multiple inverters cascade-connected, and the circuit current flows every time the inverter conducts the operation of inversion.

In addition, since semiconductor devices rapidly increase in operating speed, a clock or dummy pattern to pass through the delay circuit and the output dummy circuit 9 is correspondingly apt to increase in frequency. Thus, since the number of inversion operation in the inverter increases as the frequency of clock etc. becomes higher, the power consumption of the delay circuit 4 and the output dummy circuit 9 also increases.

Furthermore, in general the phase difference between dummy data DDT and external clock ECK varies depending on the surrounding temperature of semiconductor device. When the output dummy circuit 9 consumes power as much as described above, it generates heat necessarily. Therefore, the heat generated may adversely affect the delay locked operation. In other words, the operation of the output dummy circuit 9 that is installed, essentially, to remove the phase difference causes a reversed phenomenon that the phase difference is widened.

Also, the output dummy circuit 9 described above is not directly related to the essential function of the semiconductor device and does not contribute to accurate delay locked operation. Despite these, it has a big occupied area in the chip. Therefore, it causes a problem that the chip size increases by that much.

SUMMARY OF THE INVENTION

Accordingly, it is an object of the invention to provide a synchronizing method for delay locked loop, a delay locked loop, and a semiconductor device equipped with the delay locked loop that accurate delay locked operation can be conducted with low power consumption and a smaller chip size.

According to the invention, a synchronizing method for delay locked loop, comprises the step of:

conducting the delay locked operation that makes the phase of external clock ECK being supplied from outside coincide with the phase of data being output outside synchronizing with internal clock ICK that is delayed by a given delay time from the external clock ECK by changing the delay time, thereby generating the internal clock ICK synchronized with the external clock ECK;

wherein the delay locked operation is conducted only when a command or signal is supplied from outside, and the delay time changed previously is retained when the command or signal is not supplied.

According to another aspect of the invention, a delay locked loop, comprises:

a delay circuit that outputs internal clock ICK being delayed by a given delay time from external clock ECK supplied from outside;

an output circuit that outputs data being synchronized with the internal clock ICK to outside;

a phase comparison circuit that compares the phase of output data of the output circuit with the phase of the external clock ECK; and a delay time changing means for changing the delay time according to the phase comparison result of the phase comparison circuit;

wherein the delay locked loop conducts the delay locked operation to generate the internal clock ICK being synchronized with the external clock ECK only when a command or signal is supplied from outside, and the delay time changing means retains the delay time changed previously when the command or signal is not supplied.

According to another aspect of the invention, a semiconductor device, comprises, a delay locked loop that comprises:

a delay circuit that outputs internal clock ICK being delayed by a given delay time from external clock ECK supplied from outside;

an output circuit that outputs data being synchronized with the internal clock ICK to outside;

a phase comparison circuit that compares the phase of output data of the output circuit with the phase of the external clock ECK; and a delay time changing means for changing the delay time according to the phase comparison result of the phase comparison circuit;

wherein the delay locked loop conducts the delay locked operation to generate the internal clock ICK being synchronized with the external clock ECK only when a command or signal is supplied from outside, and the delay time changing means retains the delay time changed previously when the command or signal is not supplied.

According to another aspect of the invention, a semiconductor device, comprises:

a delay circuit that outputs internal clock ICK being delayed by a given delay time from external clock ECK supplied from outside;

a plurality of output circuits that output a plurality of data being synchronized with the internal clock ICK to outside;

a phase comparison circuit that compares the phase of a dummy pattern that is supplied to and output from any one of the plurality of output circuits, the dummy pattern being formed so that "H" level and "L" level are repeated at a given cycle and a given ratio, with the phase of the external clock ECK; and a delay time changing means for changing the delay time according to the phase comparison result of the phase comparison circuit;

wherein the delay locked operation to generate the internal clock ICK being synchronized with the external clock ECK is conducted only when a command or signal is supplied from outside, and when the command or signal is not supplied, the delay time changing means retains the delay time changed previously and the output circuit subjected to the supply of the dummy pattern outputs the data being synchronized with the internal clock ICK to outside.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
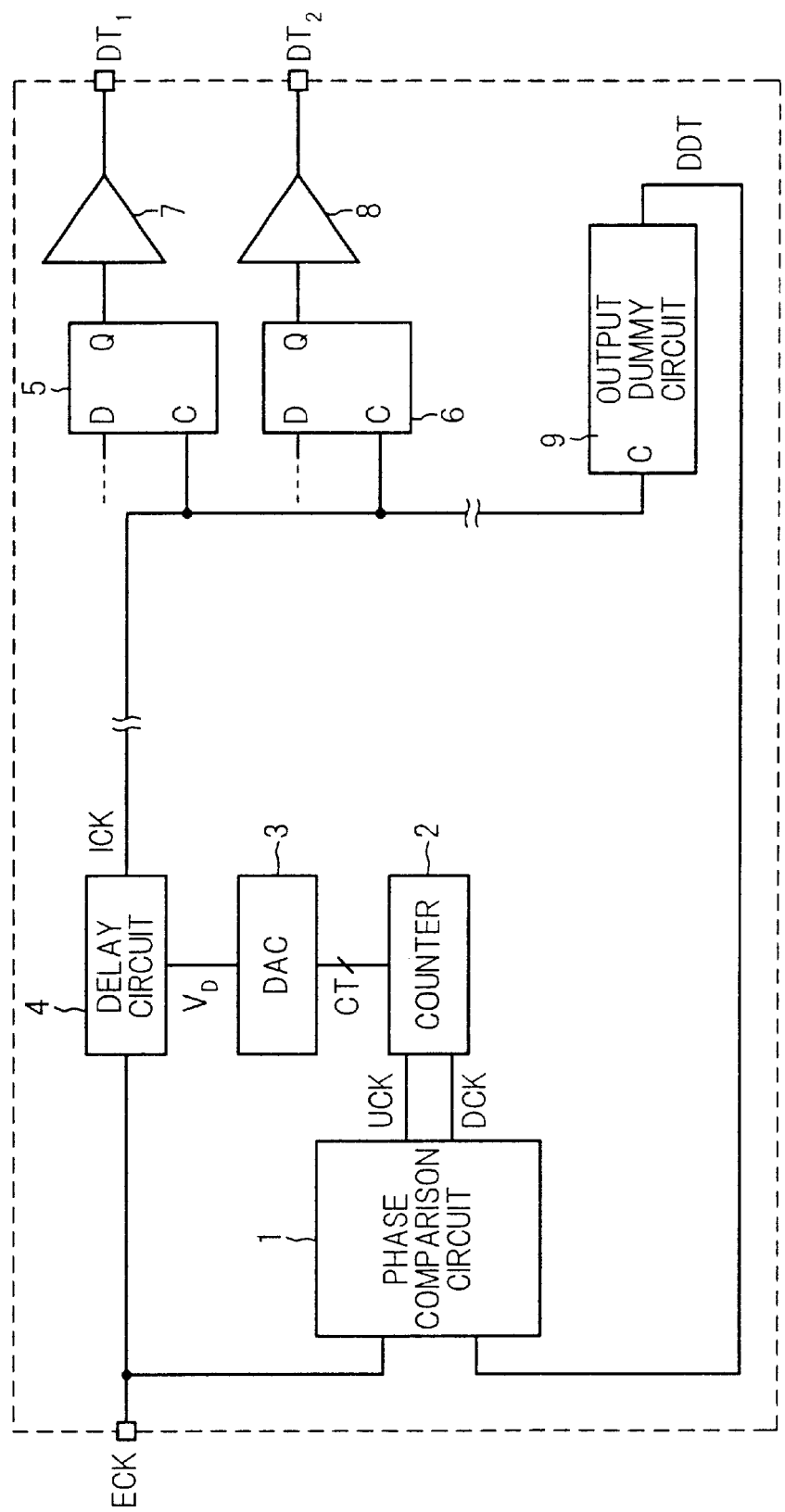
FIG. 1 is a block diagram showing an example of partial composition of semiconductor device equipped with a conventional DLL.

The preferred embodiments of the invention will be explained below, referring to the drawings.

[First Embodiment]

The first preferred embodiment of the invention will be explained below.

Figure 4:
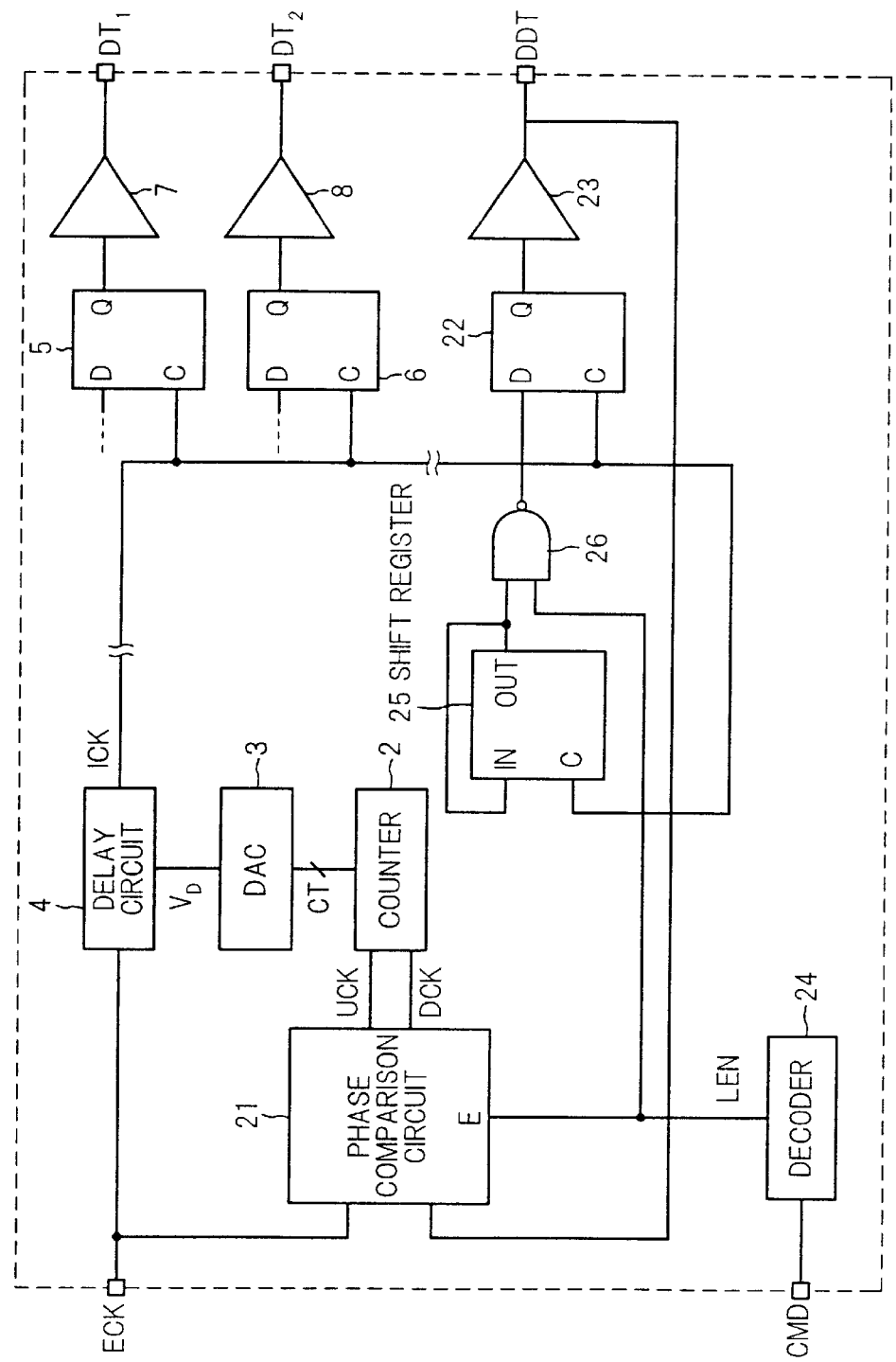
FIG. 4 is a block diagram showing an example of partial composition of semiconductor device equipped with a DLL in a first preferred embodiment according to the invention.

FIG. 4 is a block diagram showing the partial composition of a semiconductor device equipped with a delay locked loop in the first preferred embodiment according to the invention. In FIG. 4, like parts are indicated by like reference numerals as used in FIG. 1 and the explanations thereof are omitted below. The semiconductor device in FIG. 4 is, instead of the phase comparison circuit 1 and the output dummy circuit 9 in FIG. 1, composed of a phase comparison circuit 21, a FF 22, a buffer 23, a decoder 24, a shift register 25 and a NAND gate 26.

The phase comparison circuit 21 has, in addition to the function of the phase comparison circuit 1, a function of conducting the phase comparison operation only when locked operation enable signal LEN to be supplied to its enable terminal E from the decoder 24 is active. The phase comparison circuit 21 compares the phase of dummy data DDT with the phase of external clock ECK at the rising edge of dummy data DDT. When the external clock ECK is at "L" level, the phase comparison circuit 21 outputs up clock UCK, and when the external clock ECK is at "H" level, the phase comparison circuit 21 outputs down clock DCK. The FF 22 has the same function as the FFs 5 and 6.

Also, the buffer 23 has the same composition and function as the buffers 7 and 8. The output of the buffer 23 is, like the buffers 7 and 8, connected to a corresponding output terminal, and this output terminal is connected with a corresponding lead terminal by wire bonding. Thus, when the semiconductor device is mounted on a printed circuit board and the lead terminals are connected with a pattern formed on the printed circuit board by soldering, applied to the output terminal of the buffer 23 as well as to the output terminal of the buffers 7 and 8 are parasitic inductive and capacitive loads that are influenced depending on the characteristic of package and the mounting conditions.

The phase comparison circuit 21, counter 2, DAC 3, delay circuit 4, FF 22, buffer 23 compose the DDL.

The decoder 24 decodes a command CMD supplied from CPU (not shown), and when the command CMD is a delay locked command DLC to instruct the start of delay locked operation, it makes the locked operation enable signal LEN active and supplies it to the enable terminal E of the phase comparison circuit 21 and to a second input terminal of the NAND gate 26.

The shift register 25 generates a dummy pattern that "H" level and "L" level are repeatedly alternated at a given period and a given ratio synchronizing with the internal clock ICK, and supplies it to a first input terminal of the NAND gate 26. The NAND gate 26 supplies a data input terminal D of the FF 22 with the dummy pattern supplied from the shift register 25 only when the locked operation enable signal LEN is active. Meanwhile, the shift register 25 is set to be initialized with its output level of "L", therefore giving the FF 22 input level of "H", at the start of delay locked operation.

The partial operation of the semiconductor device thus composed is explained below, referring to timing charts in FIGS. 5 to 8.

It is given that the frequency of external clock ECK is 100 MHz, similarly to the circuit in FIG. 1. Also, at the beginning when power is applied to the system including the semiconductor device and CPU (not shown), the count value CT of the counter 2 is "0" and the delay voltage $V_D$ is also 0 V, therefore the delay time of the delay circuit 4 is the sum, e.g. 5 ns, of delay time of the four inverters 11 to 14 in FIG. 2. The method of delaying the internal clock ICK by a given delay time from the external clock ECK so as to make the phase of dummy data DDT coincide with the phase of external clock ECK is similar to that in the conventional DLL.

Figure 6:
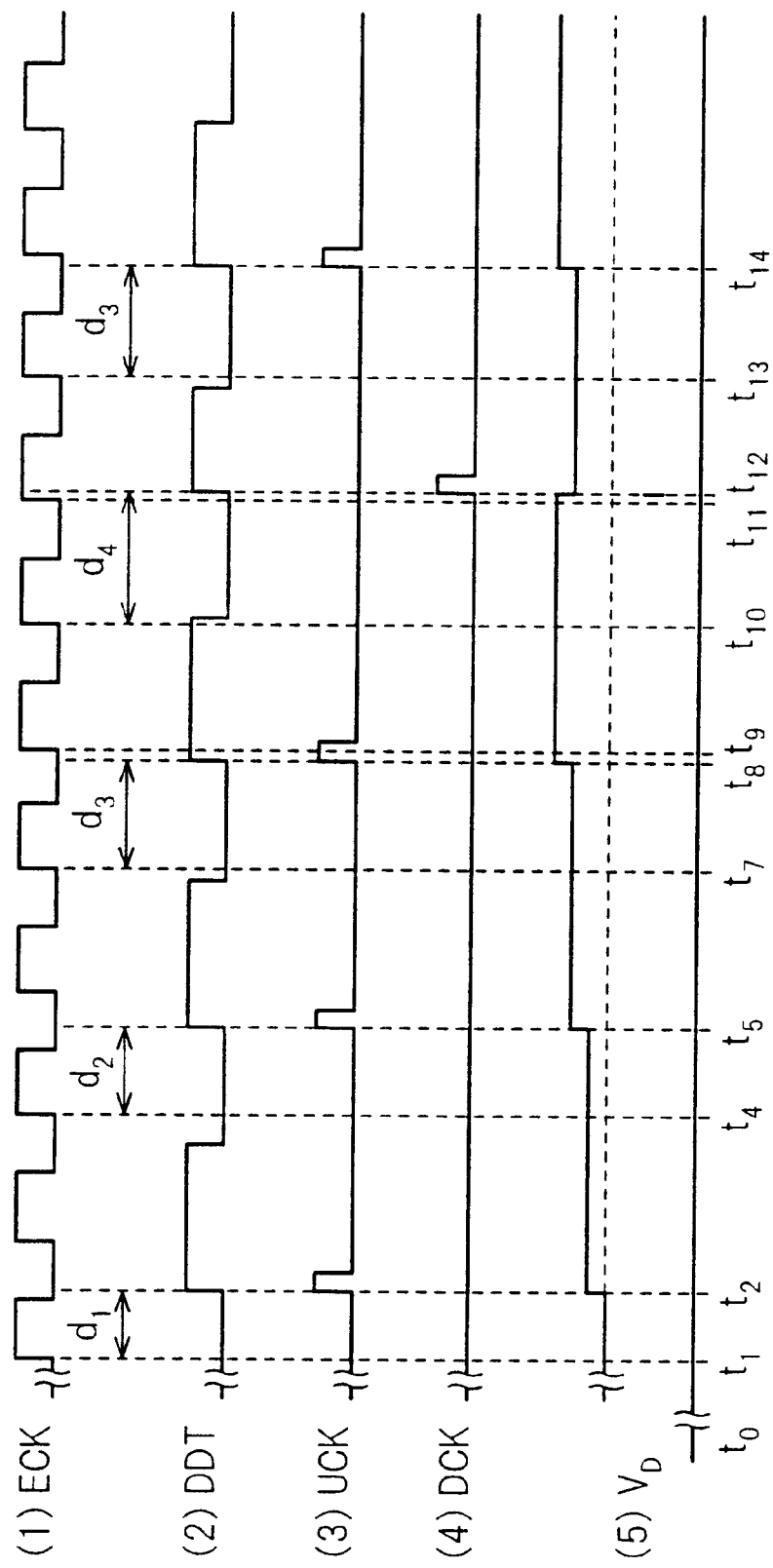

First, after power is applied to the system including the semiconductor device and CPU (not shown) at time $t_0$, when external clock ECK (see FIG. 6 (1)) is stably supplied for the semiconductor device, the CPU supplies a delay locked command DLC as the command CMD to this semiconductor device at time $t_1$, and during a predetermined time $T_1$ (e.g., about few thousand to ten thousand cycles) until the phase of dummy data DDT coincides with the phase of external clock ECK (this is called DLL is locked).

Here, the predetermined time $T_1$, and predetermined times $T_2$ and described later are to satisfy expression (1):

$$T_1, T_2, T_3 > 2 \times (CT_{MAX})/(f_{ECK}) \quad (1).$$

In expression (1), $CT_{MAX}$ represents a maximum count value of the counter 2, and $f_{ECK}$ represents the frequency of external clock ECK. The reasons why the conditions in expression (1) are to be satisfied are that there is a possibility that the phase comparison circuit 21 continues to output up clock UCK in its phase comparison operation until the count value of the counter 2 is counted up to the maximum count value $CT_{MAX}$ due to a big difference between the phase of dummy data DDT and the phase of external clock ECK, and that the cycle of dummy data DDT is about twice the cycle of external lock ECK. Also, the reason why, as shown in FIG. 5, the predetermined time $T_1$ is longer than the predetermined times $T_2$ and $T_3$ described later is that the system including the semiconductor device and CPU takes the longer time to become thermally stable after power is applied to the system.

Figure 5:
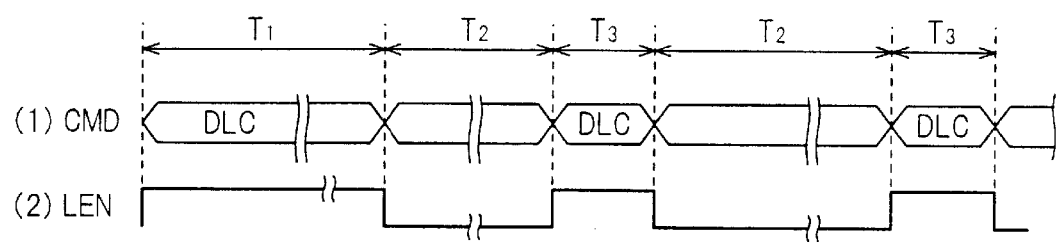
FIGS. 5 to 8 are timing charts showing part of the operation of the semiconductor device in FIG. 4.

With the delay locked command DLC supplied from the CPU (not shown), the decoder 24 decodes the delay locked command DLC, and makes the locked operation enable signal LEN active as shown in FIG. 5 (2) and supplies it to the enable terminal E of the phase comparison circuit 21 and to the second input terminal of the NAND gate 26. Thereby, the dummy pattern generated by the shift register 25 is supplied through the NAND gate 26 to the data input terminal D of the FF 22.

On the other hand, the external clock ECK (see FIG. 6 (1)) supplied for the semiconductor device is supplied to the first input terminal of the phase comparison circuit 21, and in the delay circuit 4 is concurrently delayed by a delay time (in this case, 5 ns) that is the sum of delay times of the four inverters 11 to 14, then supplied, as internal clock ICK, to the clock input terminal C of the FFs 5, 6 and 22 and the shift register 25.

Thus, the FF 22 holds and outputs the dummy pattern supplied from the NAND gate 26 synchronizing with the rise of internal clock ICK, and supplies it to the buffer 23. The buffer 23 buffers the dummy pattern supplied from the FF 22, and outputs it as the dummy data DDT from the output terminal to outside the semiconductor device and concurrently supplies it to the second input terminal of the phase comparison circuit 21 (see FIG. 6 (2)).

In this case, given that the sum of delay times of the FF 22 and the buffer 23 is 1 ns, the dummy data DDT rises 6 ns (delay time of $d_1$) after the rising of external clock ECK, i.e., at time $t_2$. Also, since the dummy data DDT alternates repeatedly between "H" level and "L" level every time the internal clock ICK rises, its frequency becomes a half (in this case, 50 MHz) of the frequency of internal clock ICK and corresponds to about a half of the frequency of external clock ECK. The reason why the frequency of dummy data DDT does not become just the half of the frequency of external clock ECK is that the phase of internal clock ICK is adjusted by the delay locked operation of dummy data DDT and the dummy data DDT is, so to speak, phase-modulated by the internal clock ICK in the FF 22.

The phase comparison circuit 21, at time t₂, checks the phase of external clock ECK at the rising of dummy data DDT, and since in this case the phase is "L" level, it outputs one up clock UCK. Thereby, the count value CT of the counter 2 is counted up "0" to "1", therefore the DAC 3 supplies the delay circuit 4 with delay voltage of 0.1 V. So, the delay time of dummy data DDT changes from the delay time $d_1$, (in this case, 6 ns) to a delay time $d_2$ (in this case, 7.5 ns).

In like manner, the phase comparison operation is conducted in the phase comparison circuit 21 at time $t_5$ and time $t_8$, the count values CT of the counter 2 at these times become "2" and "3", respectively. The delay time of dummy data DDT changes from a delay time $d_3$ (in this case, 9 ns) to a delay time $d_4$ (in this case, 10.5 ns).

Then, the phase comparison circuit 21, at time $t_{11}$, checks the phase of external clock ECK at the rising of dummy data DDT, and since in this case the phase is "H" level, it outputs one down clock DCK. Thereby, the count value CT of the counter 2 is counted down "3" to "2", therefore the DAC 3 supplies the delay circuit 4 with delay voltage of 0.2 V. So, the delay time of dummy data DDT changes from the delay time $d_4$ (in this case, 10.5 ns) to the delay time $d_3$ (in this case, 9 ns).

After that, the phase comparison circuit 21 alternately outputs up clock UCK and down clock DCK, and the delay time of dummy data DDT repeatedly alternates between the delay time $d_4$ (in this case, 10.5 ns) and the delay time $d_3$ (in this case, 9 ns). As a result, the dummy data DDT is converged into a state of delaying by about 10 ns (equivalent to one external clock ECK) from the external clock ECK. Therefore, the phase of internal clock ICK is made to delay more than before and the phase of dummy data DDT is made to coincide with the phase of external clock ECK.

Figure 7:
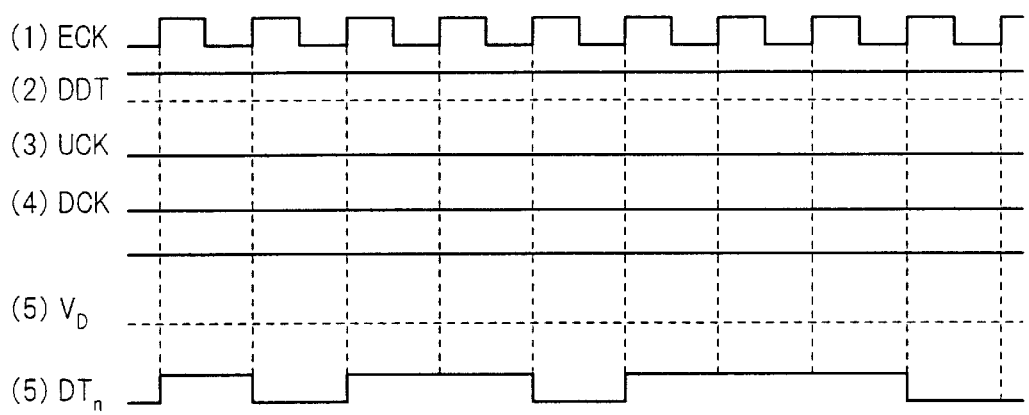

When the DLL is thus locked, as shown in FIG. 5 (1), the CPU (not shown) stops to supply the delay locked command DLC and supplies the other commands. So, the decoder 24 decodes the other commands, thereby recognizing that the supply of delay locked command DLC is stopped, and then as shown in FIG. 5 (2) makes the locked operation enable signal LEN inactive and supplies it to the enable terminal E of the phase comparison circuit 21 and to the second input terminal of the NAND gate 26. Thereby, the phase comparison circuit 21 stops to conduct the phase comparison operation, and therefore neither up clock UCK nor down clock DCK is output as shown in FIG. 7 (3) and (4). Also, the NAND gate 26 stops to output the dummy pattern and continues to output "H" level as shown in FIG. 7 (2).

At this time, the counter 2 continues to output the count value CT, a value in the case that the DLL is locked, i.e. in this case "2" or "3". So, as shown in FIG. 7 (5), the DAC 3 converts "2" or "3", the count value CT supplied from the counter 2, into a delay voltage $V_D$, i.e. in this case 0.2 V or 0.3 V, and continues to supply it to the delay circuit 4. Thus, in the delay circuit 4 the delay voltage $V_D$ of 0.2 V or 0.3 V continues to be applied to the respective gates of the FETs 15 to 17. Therefore, the source-to-drain conductance (reciprocal number of resistivity) of the FETs 15 to 17 continues to be a value corresponding to the delay voltage $V_D$ of 0.2 V or 0.3 V.

Thus, the delaying status of internal clock ICK is retained, the coincidence of the phase of external clock ECK and the phase of dummy data DDT is retained as it stands, and the delaying of the internal clock ICK by the predetermined delay time from the external clock ECK is retained as it stands.

Also, data supplied from a circuit element (not shown) in the semiconductor device to the FFs 5 and 6 are taken in by the FFs 5 and 6 at the rise of internal clock ICK supplied to the clock input terminal C, buffered by the buffers 7 and 8, output as the data $DT_1$ and $DT_2$ from the output terminal to outside the semiconductor device. The change point of the data $DT_1$ and $DT_2$ coincides with the rise of external clock ECK as shown in FIG. 7 (6).

When a given time $T_2$, e.g. 100 μs, elapses since the DLL is locked, the CPU (not shown), as shown in FIG. 5 (1), again supplies the delay locked command DLC as the command CMD to the semiconductor device during a given time $T_3$ (e.g., about 1 μs, i.e. about 10 to 20 cycles). The decoder 24 decodes the delay locked command DLC, and makes the locked operation enable signal LEN active as shown in FIG. 5 (2) and supplies it to the enable terminal E of the phase comparison circuit 21 and to the second input terminal of the NAND gate 26. Thereby, the dummy pattern generated by the shift register 25 is again supplied through the NAND gate 26 to the data input terminal D of the FF 22.

Figure 8:
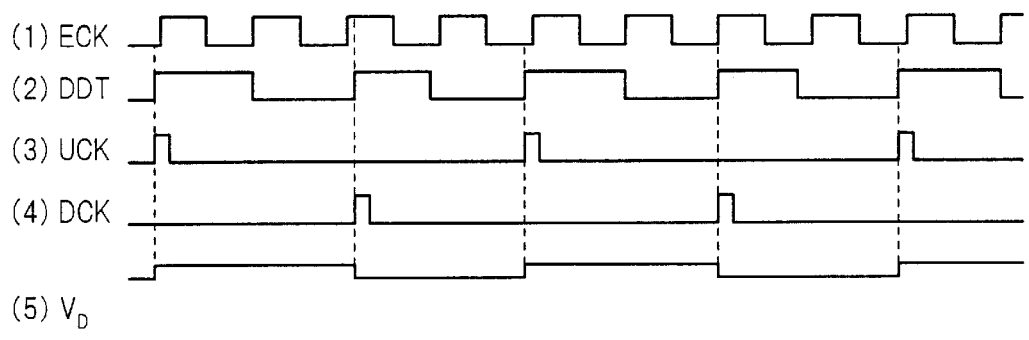

On the other hand, the external clock ECK (see FIG. 8 (1)) supplied for the semiconductor device is supplied to the first input terminal of the phase comparison circuit 21, and in the delay circuit 4 is concurrently delayed by a delay time that is the sum of delay times of the four inverters 11 to 14 and a delay time to be added according to the delay voltage $V_D$ of 0.2 or 0.3 V. Then it is supplied, as internal clock ICK, to the clock input terminal C of the FFs 5, 6 and 22 and the shift register 25.

Thus, the FF 22 holds and outputs the dummy pattern supplied from the NAND gate 26 synchronizing with the rise of internal clock ICK, and supplies it to the buffer 23. The buffer 23 buffers the dummy pattern supplied from the FF 22, and outputs it as the dummy data DDT from the output terminal to outside the semiconductor device and concurrently supplies it to the second input terminal of the phase comparison circuit 21 (see FIG. 8 (2)).

In this case, since the counter 2 stores the count value CT in the case that the DLL is locked in the given time $T_1$, the phase of dummy data DDT nearly coincides with the phase of external clock ECK as shown in FIG. 8 (1) and (2). Therefore, the DLL must be locked within a time shorter than the given time $T_1$. In case of the DLL being locked, the phase comparison circuit 21 outputs, e.g. as shown in FIG. 8 (3) and (4), one up clock UCK or one down clock DCK every other cycle of external clock ECK, and supplies it to the counter 2.

Then, the counter 2 supplies the count value CT, in this case "3" or "2", that is counted up or down according to one up clock UCK and one down clock DCK alternately supplied from the phase comparison circuit 21 every cycle of external clock ECK, to the DAC 3. The DAC 3, as shown in FIG. 8 (5), sequentially converts the count value CT, "3" or "2", supplied from the counter 2 every cycle of external clock ECK into analogue delay voltage $V_D$, e.g. in this case 0.3 V or 0.2 V, and supplies it to the delay circuit 4. Thus, since in the delay circuit 4 the delay voltage $V_D$ of 0.3 V or 0.2 V is applied to the respective gates of the FETs 15 to 17 every cycle of external clock ECK, the source-to-drain conductance (reciprocal number of resistivity) of the FETs 15 to 17 changes depending on the delay voltage $V_D$ of 0.3 V or 0.2 V.

Thereby, since the connection point between the output terminal of the inverter 11 and the input terminal of the inverter 12 is connected with one end of the capacitor 18 based on the conductance value mentioned above, the delay time of the unit delay circuit composed of the inverter 11, FET 15 and capacitor 18 becomes longer or shorter. In like manner, the delay time of the unit delay circuit composed of the inverter 12, FET 16 and capacitor 19 and the unit delay circuit composed of the inverter 13, FET 17 and capacitor 20 becomes longer or shorter. Therefore, the delay time of the entire delay circuit 4 becomes longer or shorter. Thus, the phase of internal clock ICK is made to be slightly delayed or advanced, thereby the coincidence of the phase of external clock ECK and the phase of dummy data DDT can be fine adjusted.

The fine adjustment operation of the DLL locked is, as shown in FIG. 5, repeated every other given cycle $T_2$ while power is applied to the system.

As described above, in this embodiment, the FF 22 and the buffer 23 composing the DLL have the same composition and function as the FF 5, 6 and the buffer 7, 8, respectively, composing the output circuit from which data are actually output. Also, to the output terminal of the buffer 23 as well as to the output terminal of the buffers 7 and 8, applied are parasitic inductive and capacitive loads that are influenced depending on the characteristic of package and the mounting conditions. Namely, the FF 22 and the buffer 23 have the same characteristics as the output circuit from which data are actually output. So, the coincidence between the phase of dummy data DDT to be output through them and the phase of external clock ECK allows the data $DT_1$ and $DT_2$ actually output from the output circuit to synchronize with the external clock ECK. For example, in case of a synchronous semiconductor storage that the composition of this embodiment is applied to, since data read from the synchronous semiconductor storage is synchronized with the external clock ECK, the CPU can read the data accurately, and the CPU and the system are not subjected to any malfunction.

Furthermore, in this embodiment, except when power is applied to the system, the DLL operates only when the CPU (not shown) supplies the delay locked command DLC to the DLL. Therefore, the power consumption can be reduced significantly. For example, as described earlier, when the DLL operates about 1 μs every other cycle of 100 μs, the power consumption becomes, in simple calculation, a hundredth that in the conventional case that the DLL operates continuously.

[Second Embodiment]

The second preferred embodiment of the invention will be explained below.

Figure 9:
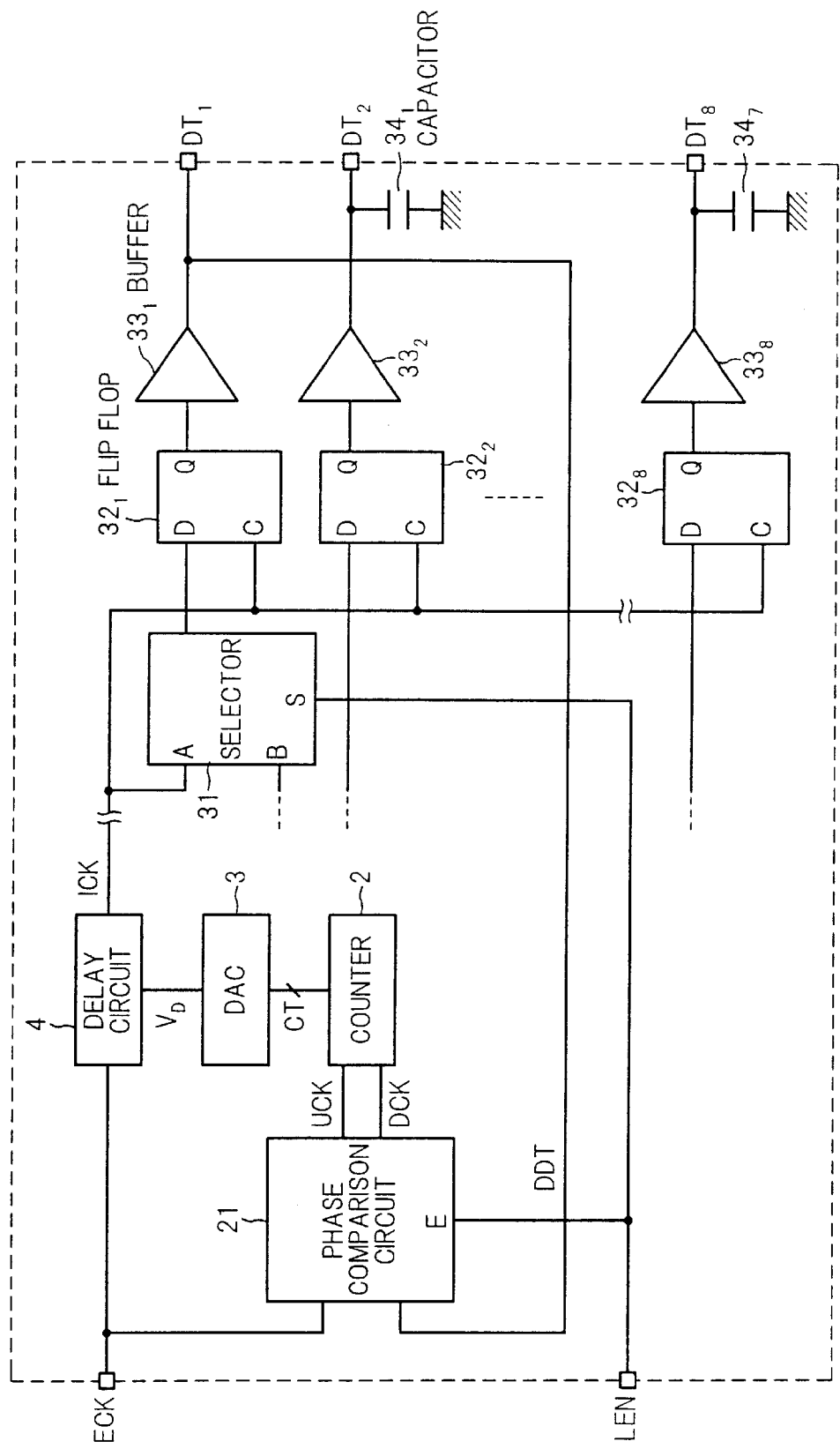
FIG. 9 is a block diagram showing an example of partial composition of semiconductor device equipped with a DLL in a second preferred embodiment according to the invention.

FIG. 9 is a block diagram showing the partial composition of a semiconductor device equipped with a delay locked loop in the second preferred embodiment according to the invention. In FIG. 9, like parts are indicated by like reference numerals as used in FIG. 4 and the explanations thereof are omitted below. The semiconductor device in FIG. 9 is composed of a selector 31, FFs $32_1$ to $32_8$, buffers $33_1$ to $33_8$ and capacitors $34_1$ to $34_7$ that are newly provided instead of the decoder 24, FFs 5, 6 and 22, buffers 7, 8 and 23, shift register 25 and NAND gate 26 in FIG. 4.

In this embodiment, the locked operation enable signal LEN is supplied from the CPU (not shown) directly to the enable terminal E of the phase comparison circuit 21 and a selection terminal S of the selector 31.

The selector 31 has a first input terminal A to which internal clock ICK is supplied and a second input terminal B to which data (least significant bit of 8-bit data), which is essentially to be input to the data input terminal D of the FF $32_1$, is supplied from a circuit element (not shown) in the semiconductor device. When the locked operation enable signal LEN supplied to the selection terminal S is active, the internal clock ICK supplied to the first input terminal A is supplied to the data input terminal D of the FF $32_1$. Also, when the locked operation enable signal LEN supplied to the selection terminal S is inactive, the internal clock ICK supplied to the second input terminal B is supplied to the data input terminal D of the FF $32_1$.

The FFs $32_1$ to $32_8$, respectively, have the same composition and function. The FF $32_1$ holds and outputs the least significant bit of 8-bit data or the internal clock ICK supplied from the selector 31 synchronizing with the rise of internal clock ICK supplied to the clock input terminal C from the delay circuit 4, and supplies it to the corresponding buffer $33_1$. The FFs $32_2$ to $32_8$ hold and output the second to seventh (=most significant) bits from the least significant bit of 8-bit data, which is supplied from a circuit element (not shown) in the semiconductor device and is to be output from the semiconductor device, synchronizing with the rise of internal clock ICK supplied to the clock input terminal C from the delay circuit 4, and supply it to the corresponding buffers $33_2$ to $33_8$.

The buffers $33_1$ to $33_8$, respectively, have the same composition and function. The buffer $33_1$ buffers data supplied from the corresponding FF $32_1$ and outputs it as data $DT_1$ to outside the semiconductor device, and supplies it as dummy data DDT to the second input terminal of the phase comparison circuit 21. The buffers $33_2$ to $33_8$, respectively, buffer data supplied from the corresponding FFs $32_2$ to $32_8$ and output them as data $DT_2$ to $DT_8$ to outside the semiconductor device. The FF $32_1$ and buffer $33_1$, FF $32_2$ and buffer $33_2$, . . . and FF $32_8$ and buffer $33_8$, respectively, compose the output circuit of data $DT_1$ to $DT_8$. Also, the output terminal of the buffers $33_1$ to $33_8$ is connected to the corresponding output terminal, which is further connected to the corresponding lead terminal by wire bonding. Thus, when the semiconductor device is mounted on a printed circuit board and the lead terminals are connected with eight patterns formed on the printed circuit board by soldering, applied to the output terminal of the buffers $33_1$ to $33_8$ are parasitic inductive and capacitive loads that are influenced depending on the characteristic of package and the mounting conditions.

Further, to the output terminal of the buffers $33_1$ to $33_8$, the capacitors $34_1$ to $34_7$ with a small capacitance, e.g. about 100 fF (femtofarad), are connected so as to compensate the wiring capacitance of wire connecting between the output terminal of the buffers $33_1$ and the second input terminal of the phase comparison circuit 21.

The partial operation of the semiconductor device thus composed is explained below, referring to timing charts in FIGS. 5, 6 and 8.

It is given that the frequency of external clock ECK is 100 MHz, similarly to the circuit in FIGS. 1 and 4. Also, at the beginning when power is applied to the system including the semiconductor device and CPU (not shown), the count value CT of the counter 2 is "0" and the delay voltage $V_D$ is also 0 V, therefore the delay time of the delay circuit 4 is the sum, e.g. 5 ns, of delay time of the four inverters 11 to 14 in FIG. 2. The method of delaying the internal clock ICK by a given delay time from the external clock ECK so as to make the phase of dummy data DDT coincide with the phase of external clock ECK is similar to that in the conventional DLL and that in the first embodiment.

First, after power is applied to the system including the semiconductor device and CPU (not shown) at time $t_0$, when external clock ECK is stably supplied for the semiconductor device, the CPU, as shown in FIG. 5 (2), makes the locked operation enable signal LEN active at time $t_1$, and supplies it to the semiconductor device during a predetermined time $T_1$ (e.g., about few thousand to ten thousand cycles) until the DLL is locked. Meanwhile, the need for the predetermined time $T_1$ and predetermined times $T_2$, $T_3$, described later, to satisfy expression (1) is similar to that in the first embodiment.

In this way, the locked operation enable signal LEN is supplied to the enable terminal E of the phase comparison circuit 21 and to the selection terminal S of the selector 31.

On the other hand, the external clock ECK (see FIG. 6 (1)) supplied for the semiconductor device is supplied to the first input terminal of the phase comparison circuit 21, and in the delay circuit 4 is concurrently delayed by a delay time (in this case, 5 ns) that is the sum of delay times of the four inverters 11 to 14, then supplied, as internal clock ICK, to the first input terminal A of the selector 31 and the clock input terminal C of the FFs $32_1$, to $32_8$.

Thus, the selector 31 supplies the internal clock ICK, which is supplied into the first input terminal A, to the data input terminal D of the FF $32_1$, and the FF $32_1$ holds and outputs the internal clock ICK, which is supplied from the selector 31, synchronizing with the rise of internal clock ICK, and supplies it to the buffer $33_1$. The buffer $33_1$ buffers the internal clock ICK which is supplied from the FF $32_1$, and outputs it as the data $DT_1$ from the output terminal to outside the semiconductor device and concurrently supplies it as dummy data DDT to the second input terminal of the phase comparison circuit 21 (see FIG. 6 (2)).

The delay locked operation of the DDL after that is similar to that explained in the first embodiment, therefore the explanations thereof are omitted here.

When the DLL is thus locked, as shown in FIG. 5 (2), the CPU (not shown) makes the locked operation enable signal LEN inactive and supplies it to the enable terminal E of the phase comparison circuit 21 and to the selection terminal S of the selector 31. Thereby, the phase comparison circuit 21 stops to conduct the phase comparison operation, and therefore, similarly to the first embodiment, the delaying status of internal clock ICK is retained, the coincidence of the phase of external clock ECK and the phase of dummy data DDT is retained as it stands, and the delaying of the internal clock ICK by the predetermined delay time from the external clock ECK is retained as it stands.

On the other hand, the selector 31 supplies data, i.e. the least significant bit of 8-bit data supplied from a circuit element (not shown) in the semiconductor device, which is supplied into the second input terminal, to the data input terminal D of the FF $32_1$. Then, the FF $32_1$ holds and outputs the least significant bit of 8-bit data, which is supplied from the selector 31, synchronizing with the rise of internal clock ICK supplied to the clock input terminal C from the delay circuit 4, and supplies it to the corresponding buffer 331. In like manner, the FFs $32_2$ to $32_8$ hold and output the second to seventh (=most significant) bits from the least significant bit of 8-bit data, which is supplied from a circuit element (not shown) in the semiconductor device and is to be output from the semiconductor device, synchronizing with the rise of internal clock ICK, and supply it to the corresponding buffers $33_2$ to $33_8$. Then, the buffers $33_1$ to $33_8$, respectively, buffer data supplied from the corresponding FFs $32_1$ to $32_8$ and output them as data $DT_1$ to $DT_8$ to outside the semiconductor device. Thus, when the locked operation enable signal LEN is inactive, the FF $32_1$ and buffer $33_1$ functions as the output circuit of data $DT_1$ as the FF $32_2$ and buffer $33_2$, ... and FF $32_8$ and buffer $33_8$, respectively, function as the output circuit of data $DT_2$ to $DT_8$. The change point of the data $DT_1$ to $DT_8$ coincides with the rise of external clock ECK as shown in FIG. 7 (6).

When a given time $T_2$, e.g. 100 µs, elapses since the DLL is locked, the CPU (not shown), as shown in FIG. 5 (2), again makes the locked operation enable signal LEN active and supplies it to the semiconductor device during a given time $T_3$ (e.g., about 1 µs, i.e. about 10 to 20 cycles). Thereby, the locked operation enable signal LEN is supplied to the enable terminal E of the phase comparison circuit 21 and to the selection terminal S of the selector 31.

On the other hand, the external clock ECK (see FIG. 8 (1)) supplied for the semiconductor device is supplied to the first input terminal of the phase comparison circuit 21, and in the delay circuit 4 is concurrently delayed by a delay time that is the sum of delay times of the four inverters 11 to 14 and a delay time to be added according to the delay voltage $V_D$ of 0.2 or 0.3 V. Then it is supplied, as internal clock ICK, to the first input terminal A of the selector 31 and to the clock input terminal C of the FFs $32_1$ to $32_8$.

The selector 31 then supplies the internal clock ICK, which is supplied into the first input terminal A, to the data input terminal D of the FF $32_1$. Thereby, the FF $32_1$ holds and outputs the internal clock ICK, which is supplied from the selector 31, synchronizing with the rise of internal clock ICK, and supplies it to the buffer $33_1$. Then, the buffer $33_1$ buffers the internal clock ICK, which is supplied from the FF $32_1$, and outputs it as data $DT_1$ from the output terminal to outside the semiconductor device and concurrently supplies it as dummy data DDT to the second input terminal of the phase comparison circuit 21 (see FIG. 8 (2)).

The fine adjustment operation of the DLL locked is similar to that in the embodiment, therefore the explanations thereof are omitted here. The fine adjustment operation of the DLL locked is, as shown in FIG. 5, repeated every other given cycle $T_2$ while power is applied to the system.

As described above, in this embodiment, the FF $32_1$ and the buffer $33_1$ function as the output dummy circuit when the locked operation enable signal LEN is active, and function as the output circuit of data $DT_1$ when the locked operation enable signal LEN is inactive, like the FF $32_2$ and the buffer $33_2$ or the others. Therefore, since it is not necessary to provide the output dummy circuit dedicated to the delay locked operation, an effect that the chip size of the semiconductor device can be reduced by that much is added to the effect obtained in the first embodiment.

Although the preferred embodiments are explained above with reference to the drawings, this invention is not limited to the above embodiments. Also, this invention may include all alterations and modifications that can be designed within the scope of the invention.

For example, the first embodiment employs the shift register 25 as a component to generate the dummy pattern. But this invention is not limited to that component. Alternatively, the component may be such a means that can preset or reset the initial value at the beginning of the delay locked operation and generate a dummy pattern that "H" level and "L" level are repeated at a given cycle and a given ratio. For example, the dummy pattern in advance stored in a memory may be read by supplying the locked operation enable signal LEN into the memory, then supplied directly to the data input terminal D of the FF 22. Also, like the second embodiment, the internal clock ICK may be supplied to the first input terminal of the NAND gate 26. On the contrary, in the second embodiment, the dummy pattern read from the shift register 25 or the memory above may be supplied to the first input terminal A of the selector 31. Furthermore, means for generating the dummy pattern may be composed of one-stage FF that an inverted data input terminal Q and a data input terminal D are connected.

Also, in the first embodiment the decoder 24 is employed as a component to decode the delay locked command DLC, which is supplied from the CPU (not shown), and to supply the locked operation enable signal LEN to the enable terminal E of the phase comparison circuit 21 and to the second input terminal of the NAND gate 26, and in the second embodiment it is employed to directly supply the locked operation enable signal LEN from the CPU (not shown) to the enable terminal E of the phase comparison circuit 21 and to the selection terminal S of the selector 31. But this invention is not limited to these. For example, in the first embodiment it may be employed to directly supply the locked operation enable signal LEN from the CPU (not shown) to the enable terminal E of the phase comparison circuit 21 and to the second input terminal of the NAND gate 26, and in the second embodiment the decoder 24 may be employed to decode the delay locked command DLC, which is supplied from the CPU (not shown), and to supply the locked operation enable signal LEN to the enable terminal E of the phase comparison circuit 21 and to the selection terminal S of the selector 31.

In the above embodiments, during the period that the locked operation enable signal LENis active, since the delay locked operation is in the process of fine adjustment operation, the data $DT_1$ and data $DT_2$ or the data $DT_1$ to $DT_8$ are not capable of being output to outside the semiconductor device. However, the fine adjustment operation of the delay locked operation can be intermittently conducted in a range causing no trouble to the operation of the semiconductor device, e.g., in a period that no data is allowed to be output due to the characteristic of semiconductor device such as refresh operation in DRAM or in a period that the semiconductor device is not accessed. When in DRAM the fine adjustment operation of the delay locked operation is conducted during the refresh operation, the refresh command can be substituted for the special delay locked command DLC.

Also, in the above embodiments, the fine adjustment operation of the delay locked operation is conducted every other given time $T_2$. But, the invention is not limited to this cycle. As described earlier, in general, the phase difference between dummy data DDT and external clock ECK varies depending on the surrounding temperature of semiconductor device. Therefore, it is also applicable that a temperature sensor to detect the surrounding temperature of semiconductor device is attached near the semiconductor device and the CPU allows the fine adjustment operation of the delay locked operation to be temporally conducted according to the output signal of the temperature sensor in a period causing no trouble to the operation of the semiconductor device.

Figure 2:
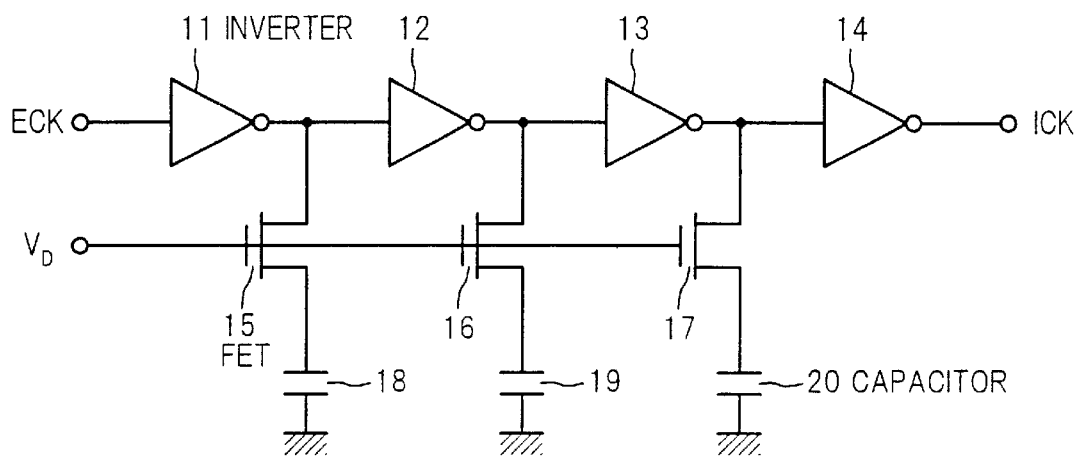
FIG. 2 is a circuit diagram showing an example of composition of delay circuit in FIG. 1.
Figure 3:
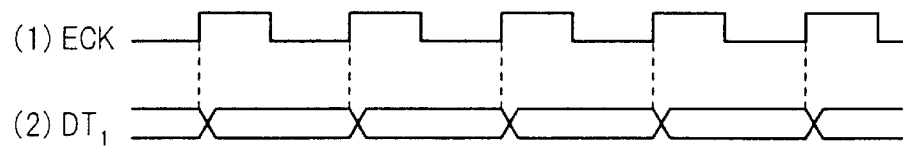
FIG. 3 is a timing chart showing a case that data $DT_1$, being actually output from the output circuit is not synchronized with external clock ECK.

In the above embodiments, the delay circuit 4 employs the composition shown in FIG. 2. But this invention is not limited to that composition. The delay circuit 4 may have any composition that the entire delay time can be changed within one cycle of the external clock ECK.

In the above embodiments, of the components of the DLL, the phase comparison circuit 21 is employed as a component to output up clock UCK or down clock DCK according to the phase difference between external clock ECK and dummy data DDT, the counter 2 is employed as a component to count up or down the count value CT according to the up clock UCK or down clock DCK supplied, and the DAC 3 is employed as a component to convert the count value CT into analogue voltage $V_D$. But, this invention is not limited to these. In brief, the DLL may have any composition that allows the output of data or voltage that is used to change the delay time of the delay circuit according to the phase difference between external clock ECK and actual data being output to outside the semiconductor device, and allows the output of data or voltage that is used to retain the changed delay time while the delay locked operation stops.

ADVANTAGES OF THE INVENTION

In this invention, the delay locked operation is intermittently conducted only when a command or signal is supplied from outside, and a delay time changed in the delay locked operation is retained thereafter in the period that the command or signal is not supplied. Therefore, the fine delay locked operation can be performed with very low power consumption.

Also, in this invention, the dummy pattern used in conducting the phase comparison between internal clock ICK and external clock ECK is obtained through the output circuit that has the same characteristics as the output circuit from which data are actually output. Therefore, the accurate coincidence between internal clock ICK and external clock ECK can be obtained regardless of the parasitic inductive and capacitive loads that are influenced depending on the characteristic of package and the mounting conditions. Thereby, the delay locked operation can be always conducted accurately.

Especially in the second embodiment of the invention, the output circuit that has the same composition as the output circuit from which data are actually output is used to conduct the phase comparison between internal clock ICK and external clock ECK. Therefore, since it is not necessary to provide the output dummy circuit dedicated to the delay locked operation, the chip size of the semiconductor device can be reduced by that much.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A delay locked loop, comprising:
   a delay circuit that receives an external clock external to the delay locked loop and outputs an internal clock delayed by a delay time from the external clock;
   an output circuit that outputs data synchronized with the internal clock;
   a phase comparison circuit that compares the phase of the output data of the output circuit with the phase of the external clock; and
   a delay time changing means for changing the delay time according to a phase comparison result of said phase comparison circuit;
   wherein said delay locked loop conducts a delay locked operation to generate the internal clock synchronized with the external clock ECK only when a command signal is supplied to the delay locked loop and said delay time changing means retains a current delay time when the command signal is not supplied.

2. A delay locked loop, according to claim 1, further comprising:
   a dummy pattern generating means for generating a dummy pattern where "H" level and "L" level are repeated at a given cycle and a given ratio, and for supplying the dummy pattern to said output circuit when the command signal is supplied.

3. A delay locked loop, according to claim 1, wherein:
   said output circuit is a circuit that, in normal operation, outputs actual data synchronized with the internal clock and outputs a dummy pattern where an "H" level and "L" level are repeated at a given cycle and a given ratio when the command signal is supplied.

4. A delay locked loop, according to claim 1, wherein:
said output circuit has the same function and characteristic as an output circuit that, in normal operation, outputs actual data synchronized to the internal clock.

5. A delay locked loop, according to claim 2, wherein:
said dummy pattern generating means is composed of a shift register or a memory.

6. A delay lock loop, according to claim 1, wherein:
said output circuit receives and outputs the internal clock as said data.

7. A semiconductor device, comprising:
a delay locked loop that comprises:
  a delay circuit that receives an external clock external to the delay locked loop and outputs an internal clock delayed by a delay time from the external clock;
  an output circuit that outputs data synchronized with the internal clock;
  a phase comparison circuit that compares the phase of output data of the output circuit with the phase of the external clock; and
  a delay time changing means for changing the delay time according to a phase comparison result of said phase comparison circuit;
  wherein said delay locked loop conducts a delay locked operation to generate the internal clock synchronized with the external clock only when a command signal is supplied to the delay locked loop, and said delay time changing means retains a current delay time when the command signal is not supplied.

8. A semiconductor device, comprising:
a delay circuit that receives an external clock external to the delay locked loop and outputs an internal clock delayed by a delay time from the external clock;
a plurality of output circuits that output a plurality of data synchronized with the internal clock ICK;
a phase comparison circuit that compares the phase of a dummy pattern that is supplied to and output from a particular one of said plurality of output circuits, said dummy pattern being formed so that "H" level and "L" level are repeated at a given cycle and a given ratio, with the phase of the external clock; and
a delay time changing means for changing the delay time according to a phase comparison result of said phase comparison circuit;
wherein a delay locked operation to generate the internal clock synchronized with the external clock is conducted only when a command signal is supplied, and when the command signal is not supplied, said delay time changing means retains a current delay time and said output circuit which receives the dummy pattern outputs the data synchronized with the internal clock ICK.

9. A semiconductor device, according to claim 8, wherein:
said dummy pattern is read from a shift register or a memory, or is the internal clock.

10. A semiconductor device, according to claim 8, wherein:
of said plurality of output circuits, the output circuits except said particular output circuit each have an output terminal that is connected to a capacitor to compensate the wiring capacitance of wire connecting between the output terminal of said output circuit and the input terminal of said phase comparison circuit.

11. A semiconductor device, according to claim 7, wherein:
said command signal is supplied when no data is allowed to be output due to the characteristic of said semiconductor device or no data is allowed to be output due to the characteristic of said semiconductor device or when said semiconductor device is not accessed.

12. A semiconductor device, according to claim 8, wherein:
said command signal is supplied when no data is allowed to be output due to the characteristic of said semiconductor device or when said semiconductor device is not accessed.

13. A semiconductor device, according to claim 11, wherein:
said semiconductor device is a semiconductor storage, and the time when no data is allowed to be output due to the characteristic of said semiconductor device is when a refresh operation of data is conducted.

14. A semiconductor device, according to claim 12, wherein:
said semiconductor device is a semiconductor storage, and the time when no data is allowed to be output due to the characteristic of said semiconductor device is when a refresh operation of data is conducted.

15. A semiconductor device, according to claim 7, further comprising:
a temperature sensor that detects a surrounding temperature of said semiconductor device; and
wherein said command signal is supplied according to the output of said temperature sensor.

16. A semiconductor device, according to claim 8, further comprising:
a temperature sensor that detects a surrounding temperature of said semiconductor device; and
wherein said command or signal is supplied according to the output of said temperature sensor.

17. A method for adjusting a phase of an internal clock signal using a delay locked loop, the method comprising:
receiving an external clock signal;
producing an internal clock signal delayed by a delay time from the external clock signal;
outputting data from an output circuit in synch with the internal clock signal;
comparing the phase of the data output from the output circuit with the phase of the external clock signal to produce a difference signal; and
altering the delay time based on the difference signal; wherein
  the comparing is performed only when a command signal is supplied; and
  when the command signal is not supplied, a current delay time is used.

18. The method as recited in claim 17, wherein the data output from the output circuit is a dummy pattern where a high and low level are repeated at a given cycle and a given ratio, and the dummy pattern is supplied to the output circuit when the command signal is supplied.

19. The method as recited in claim 18, wherein the dummy pattern is read from a shift register, or a memory or is the internal clock.

* * * * *